(12) United States Patent
Teranishi

(10) Patent No.: US 9,640,950 B2
(45) Date of Patent: May 2, 2017

(54) OPTICAL APPARATUS PROVIDING OPTICAL AMPLIFIER UNIT PLUGGABLY RECEIVING EXTERNAL OPTICAL FIBER

(71) Applicant: Sumitomo Electric Device Innovations, Inc., Yokohama-shi (JP)

(72) Inventor: Ryota Teranishi, Yokohama (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 14 days.

(21) Appl. No.: 14/794,327

(22) Filed: Jul. 8, 2015

(65) Prior Publication Data

US 2016/0013622 A1 Jan. 14, 2016

(30) Foreign Application Priority Data

Jul. 9, 2014 (JP) ................................ 2014-141629

(51) Int. Cl.
| | | |
|---|---|---|
| *H04B 10/25* | (2013.01) | |
| *H01S 5/50* | (2006.01) | |
| *H04B 10/67* | (2013.01) | |
| *H04B 10/564* | (2013.01) | |
| *H01S 5/022* | (2006.01) | |
| *H01S 5/024* | (2006.01) | |

(52) U.S. Cl.
CPC ............. *H01S 5/50* (2013.01); *H04B 10/564* (2013.01); *H04B 10/673* (2013.01); *H01S 5/02216* (2013.01); *H01S 5/02284* (2013.01); *H01S 5/02415* (2013.01)

(58) Field of Classification Search
CPC .. H01S 5/02284; H01S 5/146; H01S 3/06754; G02B 6/4206
USPC .......................................................... 398/142
See application file for complete search history.

(56) References Cited

U.S. PATENT DOCUMENTS

| | | | | |
|---|---|---|---|---|
| 2003/0072076 A1* | 4/2003 | Yoon | ................... | H01S 5/02284 359/344 |
| 2003/0179997 A1* | 9/2003 | Hwang | ................. | G02B 6/266 385/34 |
| 2004/0264888 A1* | 12/2004 | Go | ......................... | G02B 6/325 385/92 |
| 2005/0185889 A1* | 8/2005 | Xia | ........................ | B82Y 20/00 385/43 |
| 2013/0148970 A1* | 6/2013 | Nakajima | ............... | H04J 14/02 398/79 |

FOREIGN PATENT DOCUMENTS

JP    H6-232814 A    8/1994

* cited by examiner

*Primary Examiner* — Don N Vo
(74) *Attorney, Agent, or Firm* — Venable LLP; Michael A. Sartori; Laura G. Remus

(57) ABSTRACT

An optical amplifying unit that enhances the flexibility of the installation within the system is disclosed. The optical amplifying unit includes a semiconductor optical amplifier (SOA) and a housing that encloses the SOA. The housing provides a front wall with a front window that passes an optical axis coming from the SOA. The optical amplifying unit further provides a front coupling unit directly fixed to the front wall without interposing any optical fibers. The optical coupling unit has the optical receptacle function to pluggably receive an external optical plug.

8 Claims, 14 Drawing Sheets

US 9,640,950 B2

OPTICAL APPARATUS PROVIDING OPTICAL AMPLIFIER UNIT PLUGGABLY RECEIVING EXTERNAL OPTICAL FIBER

BACKGROUND OF THE INVENTION

Field of the Invention

The present application relates to an amplifying unit implementing a semiconductor optical amplifier (SOA).

Recent optical communication system often provides an optical amplifier to amplify a faint optical signal directly without converting into an electrical signal. One type of optical amplifiers installs a semiconductor optical amplifier (SOA). FIG. 14 is a functional diagram of an amplifying system including an amplifying unit 100 that installs an SOA therein. The amplifying unit 100 provides a housing 102 to enclose the SOA therein, and two optical fibers, 104 and 106, each extracted from the housing 102. One of the optical fibers 104 provides an optical connector 108 in an end thereof to couple optically with another optical connector 112. The other optical fiber 106 also provides an optical connector 114 in an end thereof to couple optically with another optical connector 120 secured in an end of another optical fiber 118 that extends from an optical unit, for instance, an optical receiver unit 116.

This arrangement around the amplifying unit 100, that is, the housing 102 with two optical fibers, 104 and 106, extracted therefrom, and respective optical connector, 108 and 114, makes the installation of the amplifying unit 100 in the optical apparatus complex and the handling of the optical fibers, 104 and 106, troublesome.

SUMMARY OF THE INVENTION

An aspect of the present application relates to an optical apparatus that comprises an amplifier unit and a front coupling unit. The amplifier unit includes a semiconductor optical amplifier (SOA) with front and rear facets, and a housing that encloses the SOA therein and provides front and rear walls. The front wall has a front window that passes a front optical axis extending from the front facet of the SOA. The rear wall has a rear window that passes a rear optical axis extending from the rear facet of the SOA. The front coupling unit is fixed to the front wall of the housing of the amplifier unit. A feature of the optical apparatus of the present application is that the front coupling unit may pluggably receive an external optical fiber.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENTS

Next, some embodiment of the present application will be described as referring to drawings. However, the present invention is not limited to those embodiments disclosed herein but many modifications and changes may be made without departing from the broader spirit and scope of the present invention. Accordingly, it is intended that the invention includes all embodiments falling within the scope of the appended claims. In the description of the drawings, numerals or symbols same with or similar to each other will refer to elements same with or similar to each other without duplicated explanations.

(First Embodiment)

Figure 1:
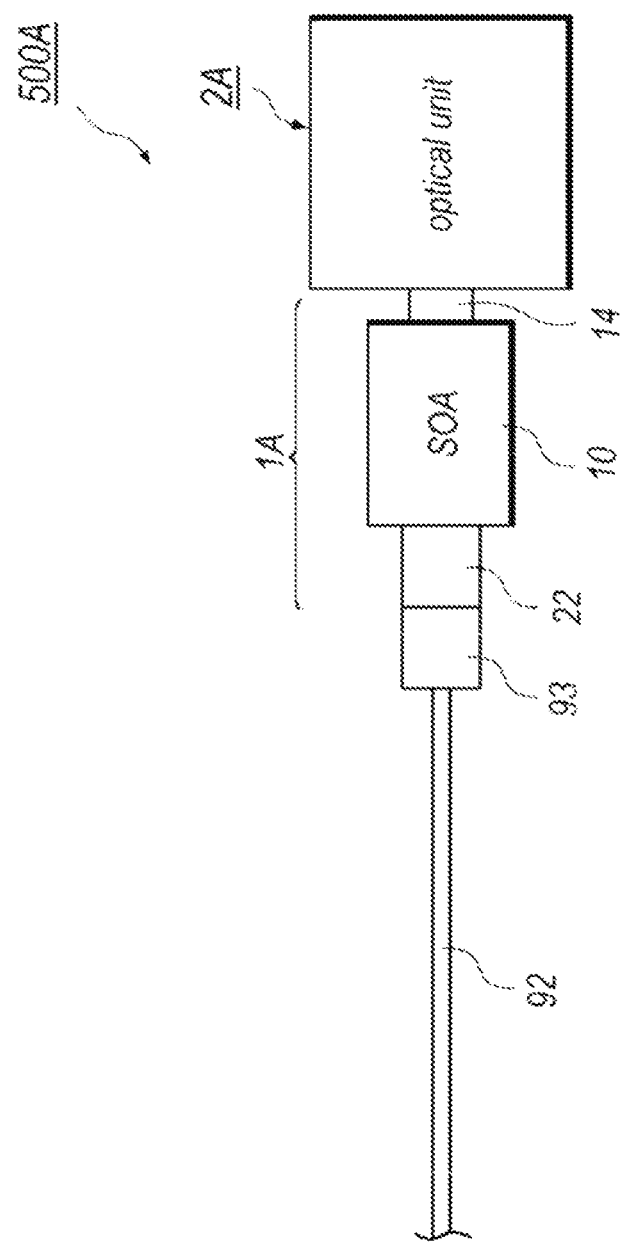
FIG. 1 schematically illustrates an optical apparatus including an amplifying unit, another optical unit, and a front coupling unit, which is according to the first embodiment of the present application.

FIG. 1 schematically illustrates an optical apparatus 500A according to the first embodiment of the present application, where the optical apparatus 500A comprises an amplifying unit 1A coupled with an external optical unit 2A, for instance a receiver unit, through a front coupling unit 14. The amplifying unit 1A provides a housing 10 that installs a semiconductor optical amplifier (SOA) 41 and a front coupling unit 22 attached to the housing 10 and passes the optical axis extending from one end of the front coupling unit 22. The front coupling unit 22 pluggably receives an optical plug 93 secured in an end of an external optical fiber 92. The explanation provided below assumes that a direction "front" and/or "forward" corresponds to a direction where the front coupling unit 22 is provided with respect to the housing 10, and another direction "rear" and/or "back" corresponds to another direction opposite to the former direction. These directions and descriptions are only for the explanation sake and may not affect the scope of the invention.

Figure 2:
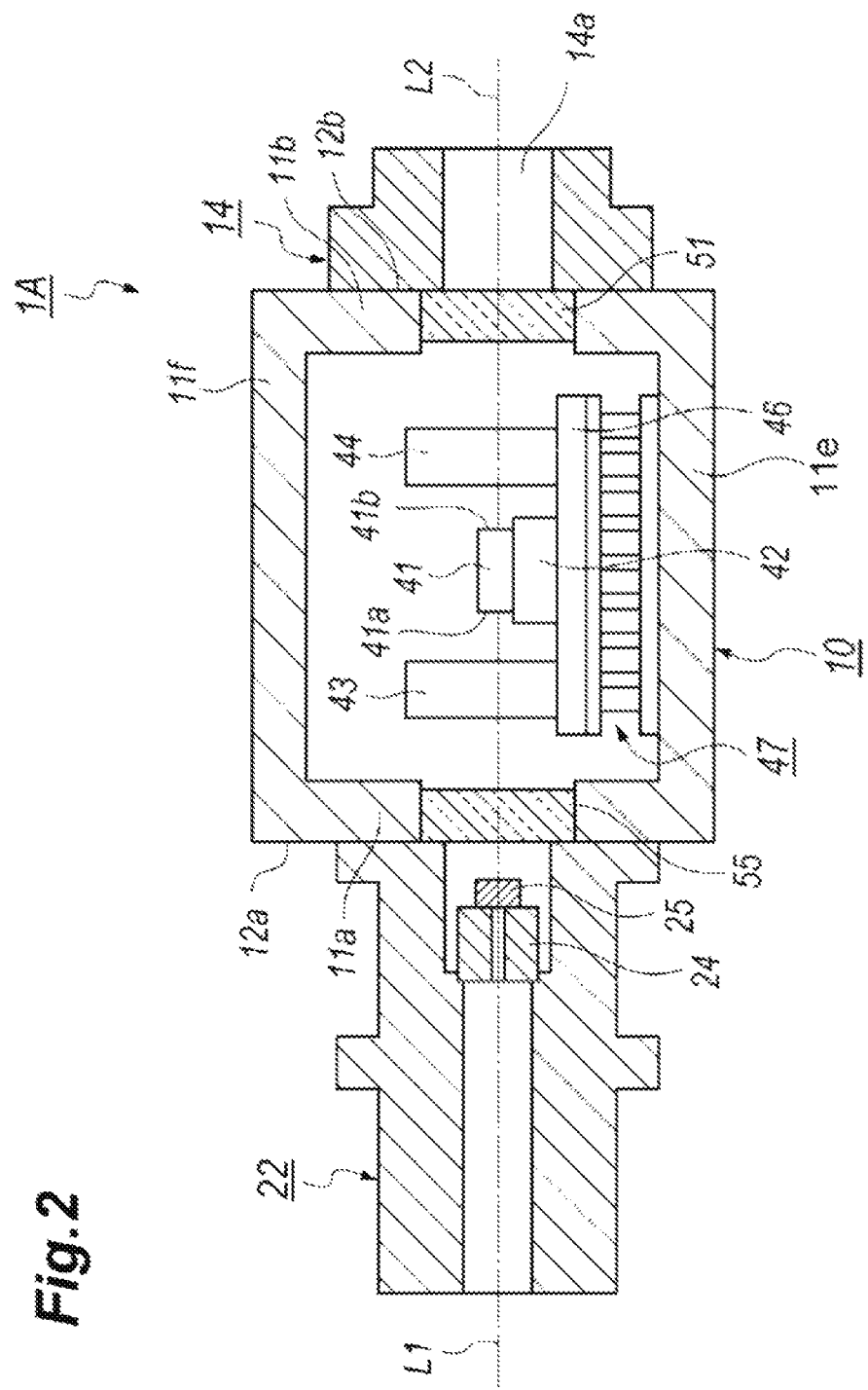
FIG. 2 is a longitudinal cross section of the amplifying unit shown in FIG. 1.
Figure 3:
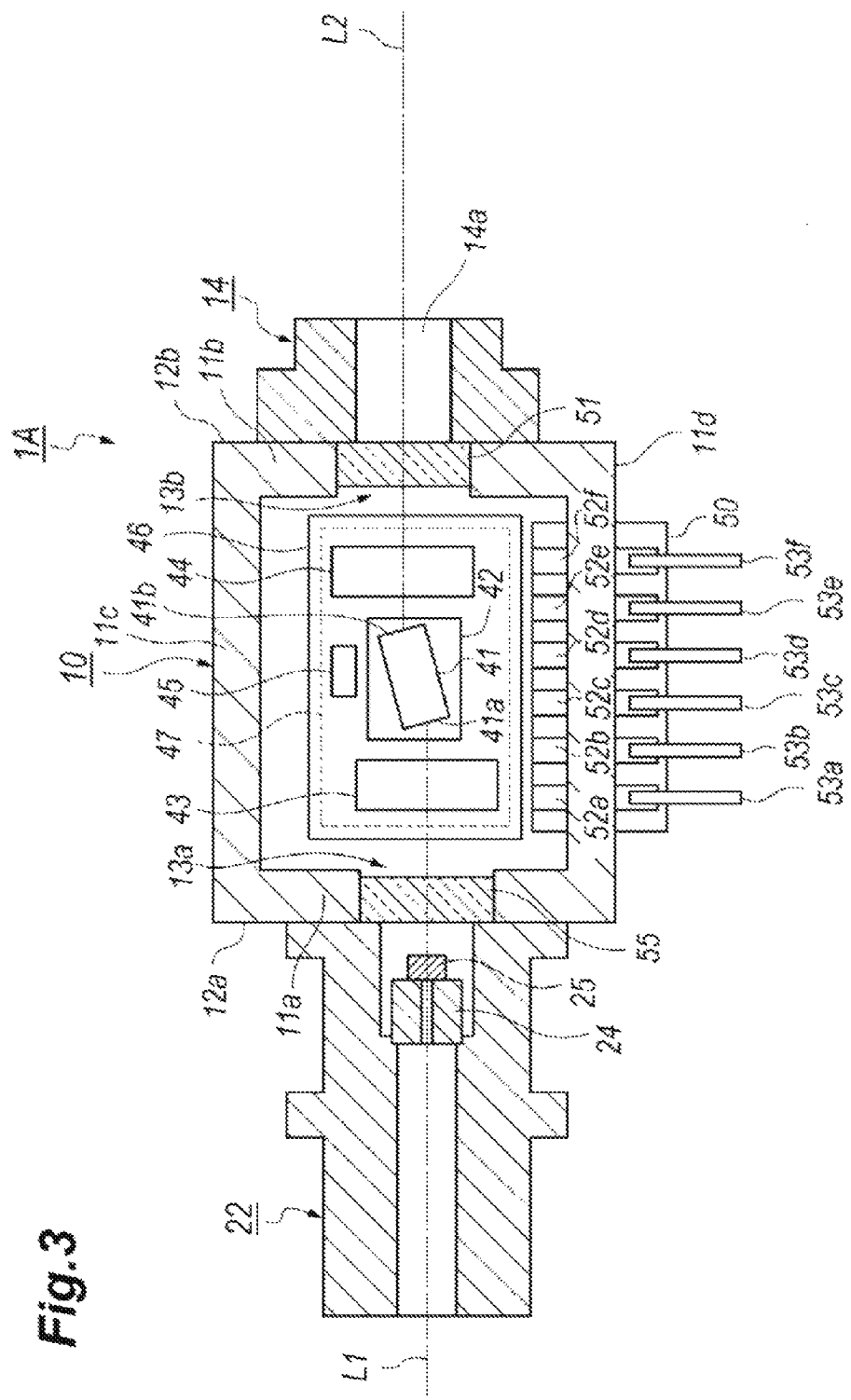
FIG. 3 is a transverse cross section of the amplifying unit shown in FIGS. 1 and 2.

FIG. 2 is a longitudinal cross section of the amplifying unit 1A shown in FIG. 1 and FIG. 3 is a transverse cross section thereof. As shown in FIGS. 2 and 3, the amplifying unit 1A provides, in addition to the housing 10 and the front coupling unit 22, a semiconductor optical amplifier (SOA) 41, a rear window 51, and a front lens 55.

The housing 10 provides a front wall 11a, a rear wall 11b, two side walls, 11c and 11d, a bottom 11e, and a lid 11f, to form a rectangular box. These walls, 11a to 11f, except for the bottom 11e may be made of metal alloy containing iron (Fe), nickel (Ni), and cobalt (Co), which is often called as Kovar. The bottom 11e may be made of metal having relatively better thermal conductivity, which is typically copper tungsten (CuW). The front wall 11a has an external surface 12a, the front surface, to which the front coupling unit 22 is fixed, and a front opening 13a that secures a front lens 55 therein, through which a front optical axis L1 extending from the SOA 41 passes. The rear wall 11b also has an external surface 12b, the rear surface, to which an external optical unit, which will be described later, is to be coupled through the rear coupling unit 14. The rear wall 11b provides a rear opening 13b that secures a rear window 51 therein, through which a rear optical axis L2, the rear optical axis, extending from the SOA 41 passes.

The housing 10 encloses the SOA 41, a sub-carrier 42, front and rear collimating lenses, 43 and 44, a thermistor 45, a carrier 46, and a thermo-electric cooler (TEC) 47. The SOA 41 is mounted on the carrier 46 through the sub-carrier 42, while, other optical components, namely, two collimating lenses, 43 and 44, and the thermistor 45 are directly mounted on the carrier 46. The TEC 47 mounts the carrier 46 thereon.

The SOA 41 may be made of semiconductor materials of InP and those having lattice constants similar to that of InP. Specifically, the SOA 41 provides, on an n-type InP substrate, an n-type InP lower cladding layer; and an active layer having the multi-quantum well structure comprised of a plurality of InGaAsP well layers and a plurality of InGaAsP barrier layers alternately stacked to each other. The InGaAsP of the well layers have a composition different from that of the barrier layers. The SOA 41 provides a front facet 41a and a rear facet 41b, where the former facet 41a faces and optically couple with the front collimating lens 43, while, the latter facet 41b faces and optically couples with the rear collimating lens 44. That is, the SOA 41 is put between two collimating lenses, 43 and 44, as being inclined with optical axes, L1 and L2, of two collimating lenses, 43 and 44, to suppress stray light from entering the SOA 41. The sub-carrier 42, which mounts the SOA 41 thereon, may be made of aluminum nitride (AlN). As described, the carrier 46 mounts the sub-carrier 42, two collimating lenses, 43 and 44, and the thermistor 45 thereon. The TEC 47, which may be a Peltier cooler, control a temperature of those components placed thereon. The thermistor 45, which, is placed close to the SOA 41, may detect a temperature of the TEC 47.

The side wall 11d provides a feedthrough 50 that has, for instance, six interconnections, 52a to 52f, each connected to the TEC 47, the SOA 41, and the thermistor 45, and six lead pins, 53a to 53f, connected to respective interconnections, 52a to 52f. The SOA 41 and the thermistor 45 may communicate with, external apparatuses of the amplifying unit 1A through the interconnections 52a to 52f, and the lead pins, 53a to 53f The feedthrough 50 may be made of ceramics, while, the interconnections, 52a to 52f, and the lead pins, 53a to 53f, may be made of copper (Cu) based metal coated with gold (Au).

The front coupling unit 22, which may be made of stainless steel, is fixed to the front surface 12a of the housing 10 by, for instance, the welding. The front coupling unit 22 passes the front optical axis L1 extending from the front facet 41a of the SOA 41. The front coupling unit 22 may have a type of an optical receptacle, which pluggably receives an optical plug 93 shown in FIG. 1. The front coupling unit 22 includes a stub 24 made of ceramics and an optical isolator 25 optically coupled with the stub 24. The optical isolator 25 passes light going toward the SOA 41 but cuts light coming from the SOA 41.

The rear coupling unit 14, which has a cylindrical shape with a center coinciding with the rear optical axis L2, is fixed in one end thereof to the rear wall 12b of the housing 10 by, for instance, welding. Another end of the rear coupling unit 14 is fixed to external optical unit, 2A or 2B, which will be described later, by the welding. The rear coupling unit 14 passes the rear optical axis L2 drawn from the rear facet 41b of the SOA 41.

Figure 4:
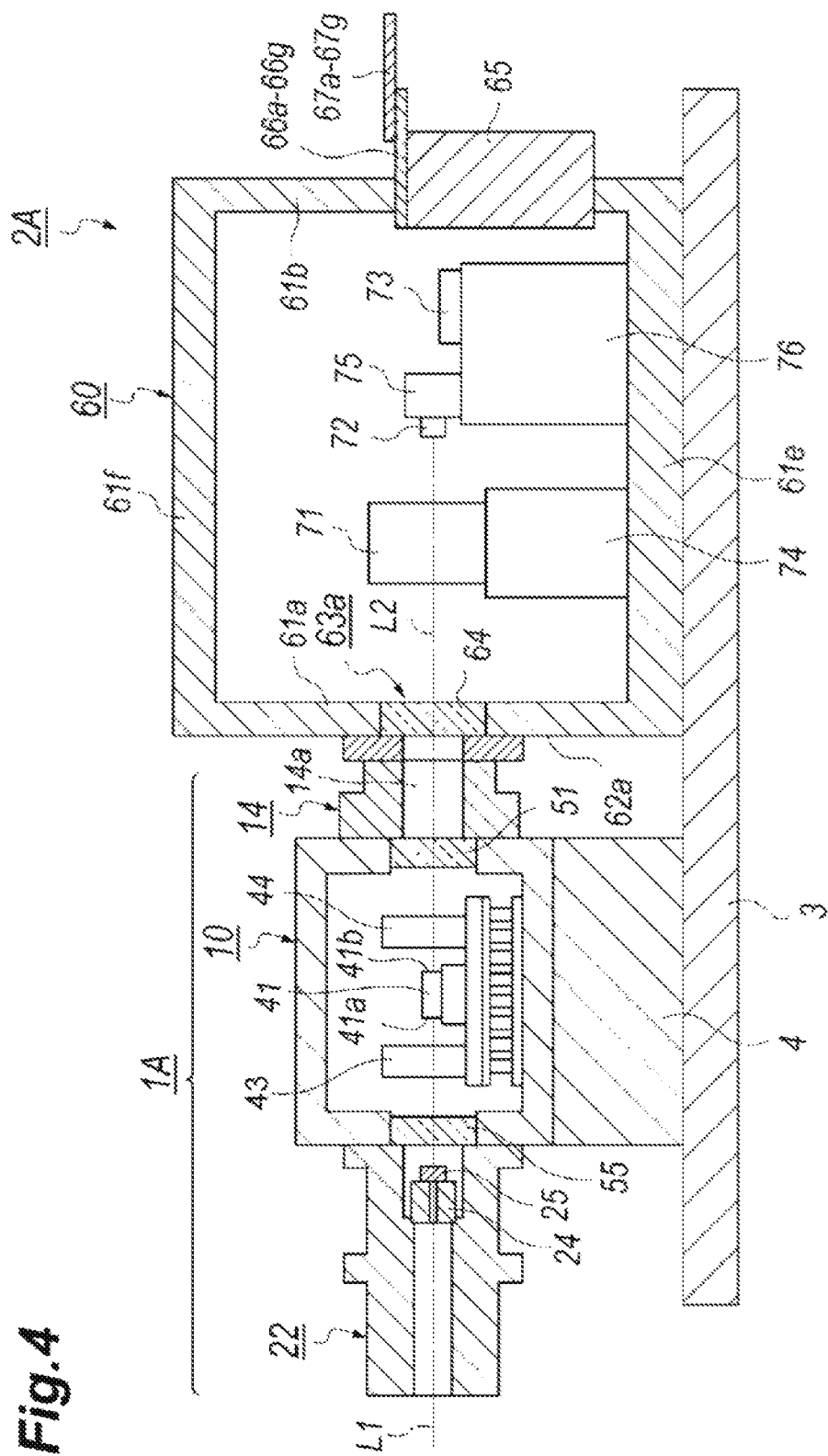
FIG. 4 is a longitudinal cross section of an optical apparatus that includes the amplifying unit and a receiver unit as an external optical unit.
Figure 5:
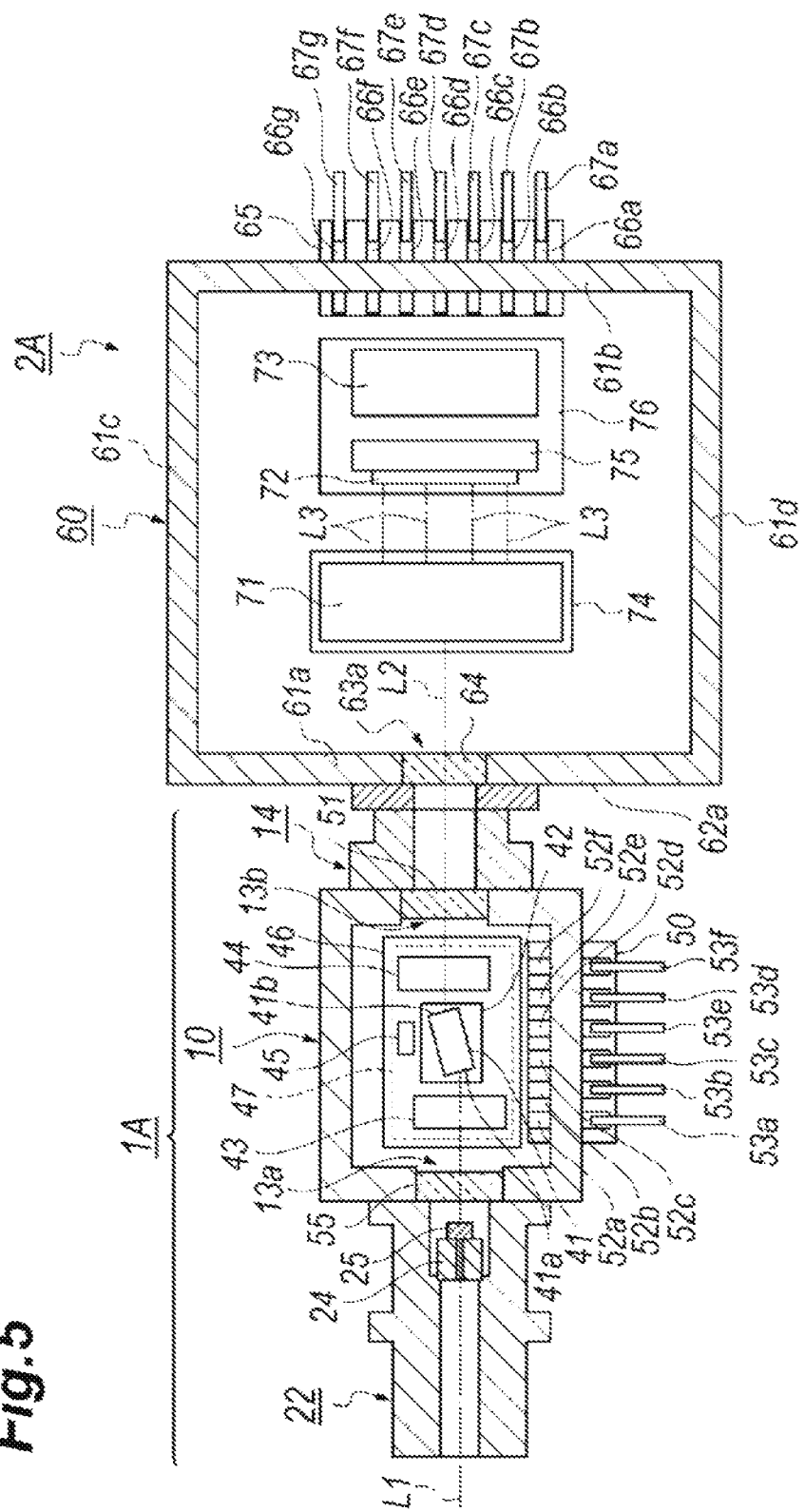
FIG. 5 is a transverse cross section of the optical apparatus shown in FIG. 4.

FIG. 4 is a transverse cross section of an optical module that integrates the amplifying unit 1A with a receiver unit 2A as an external apparatus, and FIG. 5 is a transverse cross section thereof. As shown in FIGS. 4 and 5, the receiver unit 2A provides an optical de-multiplexer 71, a photodiode (PD) array 72, and a trans-impedance amplifiers (TIA) 73 enclosed within a housing 60.

The housing 60, which has a shape of a rectangular box, may also be made of alloy like Kovar. The housing 60 provides a front wall 61a, a rear wall 61b, two side walls, 61c and 61d, connecting the front wall 61a to the rear wall 61b in a right angle, a bottom 61e and a lid 61f. The front wall 61a includes a front surface 62a to which the rear coupling unit 14 in the other end thereof is fixed, and a front opening 63a that holds a front window 64 passing the rear optical axis L2 extending from the rear facet 41b of the SOA 41.

The optical de-multiplexer 71, which optically couples with rear facet 41b of the SOA 41 through the rear collimating lens 44, the rear windows 51, the rear coupling unit 14, and the front window 64, may de-multiplex an optical signal that multiplexes a plurality of signals each having a wavelength specific thereto and different from others into individual signals depending on the wavelengths. The PD array 72 includes a plurality of PD elements arrayed along a direction perpendicular to the rear optical axis L2, where each of the PD elements may sense amplitude of respective optical signals whose optical axes are indicated by L3 in FIG. 5. The TIA 73 integrates a plurality of amplifiers each connected to respective PD elements and converting photo-currents generated thereby into respective voltage signals. The optical de-multiplexer 71 is mounted on a carrier 74. The PD array 72 is mounted in a side of a base 75 to face the optical de-multiplexer 71, and the base 75 and the TIA 73 are mounted on another carrier 76. The carriers may be made of metal alloy, for instance, Kovar.

The rear wall 61b provides a feedthrough 65 on which seven interconnections, 66a to 66g, and seven lead pins, 67a to 67g, are formed. The interconnections, 66a to 66g, are electrically connected to the PD array 72 and the TIA 73, while, the lead pins, 67a to 67g, are connected to the interconnections, 66a to 66g. Thus, the PD array 72 and the TIA 73 may communicate with external apparatuses through the interconnections, 66a to 66g, and the lead pins, 67a to 67g. The feedthrough 65, similar to the aforementioned feedthrough to in the housing 10, may be made of ceramics, and the interconnections, 66a to 66g, and the lead pins, 67a to 67g, also similar to the aforementioned interconnections, 52a to 52f, and the lead pins, 53a to 53f, may be made of copper (Cu) based metal coated with gold (Au).

Two units of the amplifying unit 1A and the receiver unit 2A are commonly mounted on a heat sink 3 made of, for instance, aluminum (Al). When a distance from the front optical axis L1 to the bottom 11e of the housing 10 is shorter than a distance from the rear optical axis L2 to the bottom 61e of the other housing 60, the housing 10 may interpose a spacer 4 illustrated in FIG. 4. The spacer 4 preferably has a function of the heat sink, that is, heat generated in the housing 10 may be dissipated to the spacer 4 through the bottom 11e of the housing 10. The spacer 4 may be made of CuW and/or copper molybdenum (CuMo) having preferable thermal conductivity.

Figure 6:
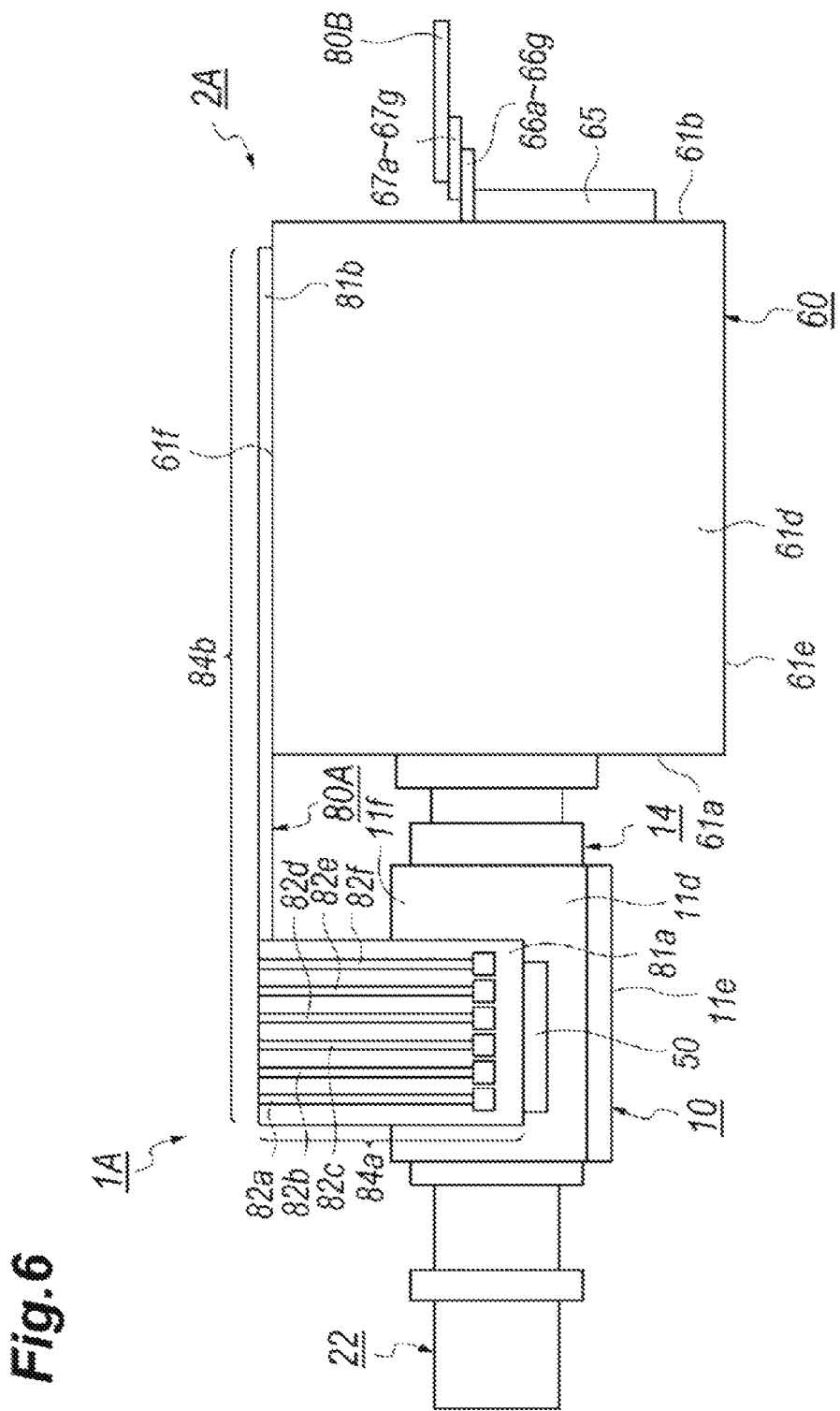
FIG. 6 is a side view of the optical apparatus.
Figure 7:
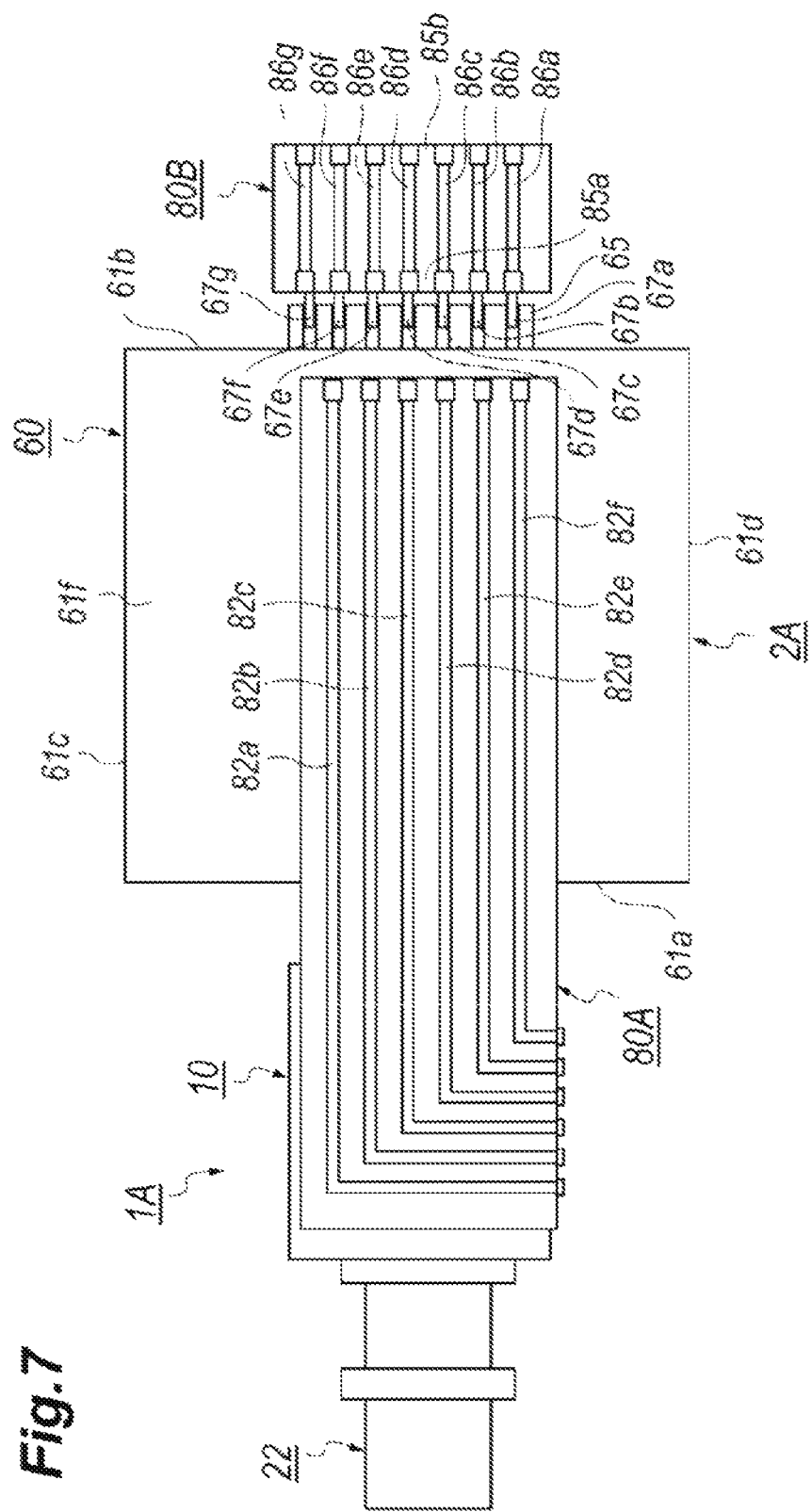
FIG. 7 is a plan view showing an arrangement of respective FPC boards in the optical apparatus.

Next, an arrangement of the electronic connection of the amplifying unit 1A and the receiver unit 2A to external apparatuses will be described as referring to FIGS. 6 and 7. Two units, 1A and 2A, may be coupled with the external apparatuses through respective flexible printed circuit (FPC) boards, 80A and 80B, each connected to the lead pins, 53a to 53f and 67a to 67g. Specifically, the FPC 80A is connected to the lead pins, 53a to 53f, of the amplifying unit 1A, while, the other FPC board 80B is connected to the lead pins, 67a to 67g, of the receiver unit 2A. FIG. 6 is a side view and FIG. 7 is a plan view showing an arrangement of respective FPC boards, 80A and 80B.

The FPC board 80A provides two ends, 81a and 81b, and conductive patterns, 82a to 82f, extending between two ends, 81a and 81b. The conductive patterns, 82a to 82f, are soldered to the lead pins, 53a to 53f, in the one end thereof. In the embodiment shown in FIG. 7, the FPC boards, 80A and 80B provide the conductive patterns, 82a to 82f and 86a to 86g, on respective top surfaces opposite to those facing the housings, 10 and 60. However, the FPC boards, 80A and 80B, may provide conductive patterns on respective bottom surfaces facing the housings, 10 and 60, or embeds the conductive patterns within respective bodies of the FPC boards, 80A and 80B. The former FPC board 80A includes a portion 84a vertically extending from the lead pins, 53a to 53f, along the side wall 11d and another portion 84b horizontally extending along the lids, 11f and 61f, to the rear wall 61b of the housing 60. The FPC board 80A thus arranged may form rooms in respective sides of the housing 10 of the amplifying unit 1A. That is, the feedthrough 50 accompanied with the FPC board 80A in a thickness thereof sticks out from the side wall 11d of the housing 10, which may shorten distances to optical components and/or optical apparatuses in a system installing the optical apparatus 500; accordingly, the system may be formed in compact.

The other FPC board 80B also provides two ends, 85a and 85b, and conductive patterns, 86a to 86g, extending from one end 85a to the other end 85b. The conductive patterns, 86a to 86g, are soldered to respective lead pins, 67a to 67g, in one end 85a. The FPC board 80B extends in a direction perpendicular to the rear wall 61b from the lead pins, 67a to 67g, that is, two FPC boards, 80A and 80B, extend in substantially parallel to the other.

Next, advantages of the amplifying unit 1A of the present embodiment will be described. The amplifying unit 1A, which installs the SOA 41 within the housing 10, provides the front coupling unit 22 fixed to the housing 10 and passing the front optical axis L1 extending from the front facet 41a of the SOA 41. The front coupling unit 22 thus configured may pluggably receive an optical plug secured in an end of the external optical fiber. Thus, the amplifying unit 1A of the embodiment integrally provides the front coupling unit 22 without interposing an auxiliary optical fiber. Accordingly, the optical apparatus 500 may enhance flexibility of the installation of the amplifying unit 1A and resultantly may be formed in compact.

The amplifying unit 1A may further provide the rear coupling unit 14 fixed thereto and passing the rear optical axis L2 extending the rear face 41b of the SOA 41. The rear coupling unit 14 may accompany with, or be assembled with the receiver unit 2A that installs the PD array 72 in the housing 60 thereof. Thus, the optical apparatus 500 may be formed in compact. The embodiment thus described installs the optical de-multiplexer 71 and the PD array 72 in the receiver unit 2A. However, the receiver unit 2A may have an arrangement to install only one PD.

The embodiment optically couples two units, 1A and 2A, through the rear coupling unit 14 with a bore 14a therein. A diameter of the bore 14a is smaller than the openings, 13b and 63a, provided in the rear wall 11b and the front wall 61a of the housings, 10 and 60, respectively. This arrangement of the bore 14a of the rear coupling unit 14 may effectively suppress stray light propagating between two housings, 10 and 60, which may stabilize the operation of the SOA 41 and suppress the noises sensed by the PD array 72. The embodiment provides the windows, 51 and 64, in the rear opening 13b and the front opening 63a, respectively. However, the openings, 13b and 63a, may hold the concentrating lenses, which may further narrow the bore 14a in the rear coupling unit 14.

(Second Embodiment)

Figure 8:
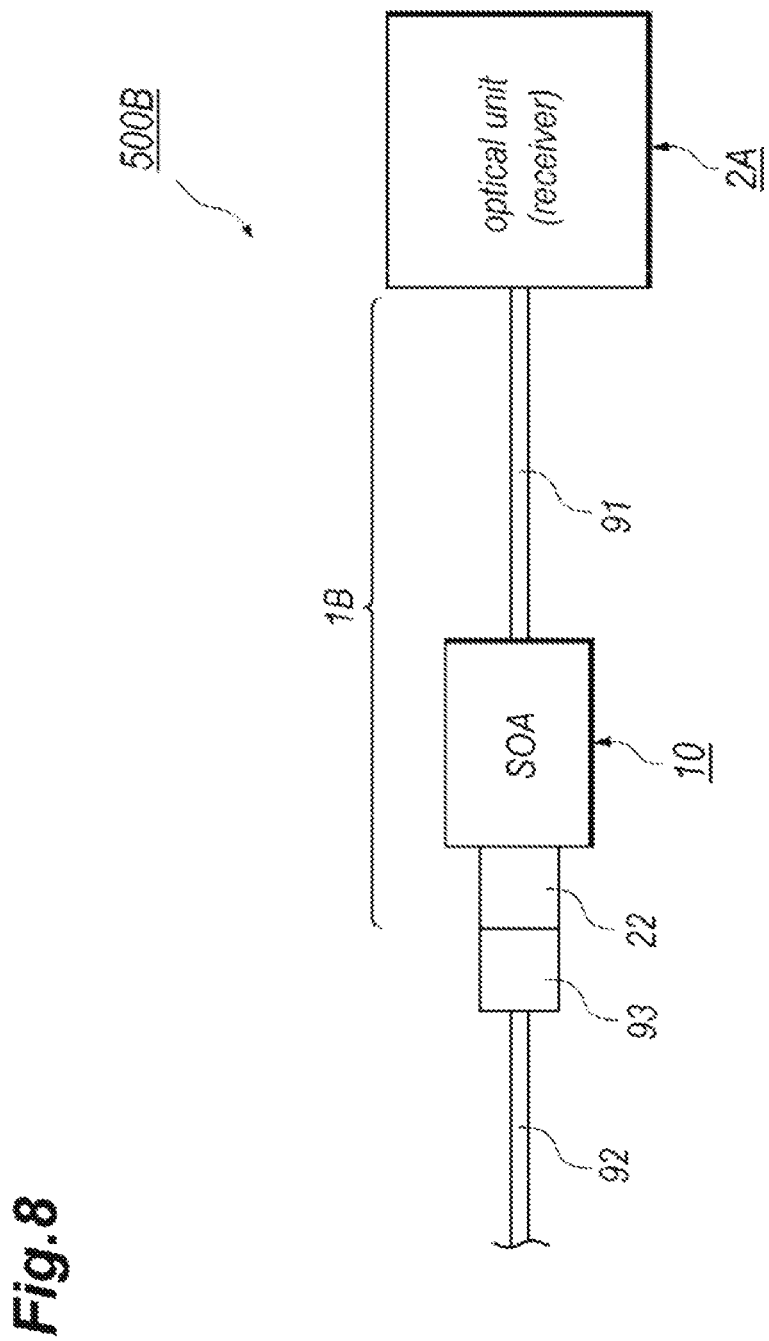
FIG. 8 schematically illustrates another optical apparatus according to the second embodiment of the present application.

FIG. 8 schematically illustrates a block diagram of an optical apparatus 500B according to the second embodiment of the present application, where the optical apparatus provides the amplifying unit 1B and the receiver unit 2A. As shown in FIG. 1, the optical apparatus 500A of the first embodiment has an arrangement that the amplifying unit 1A is coupled with the receiver unit 2A via the rear coupling unit 14, while, the present optical apparatus 500B provides, substituted from the rear coupling unit 14, an optical fiber 91 to couple the amplifying unit 1A optically with the receiver unit 2A.

Figure 9:
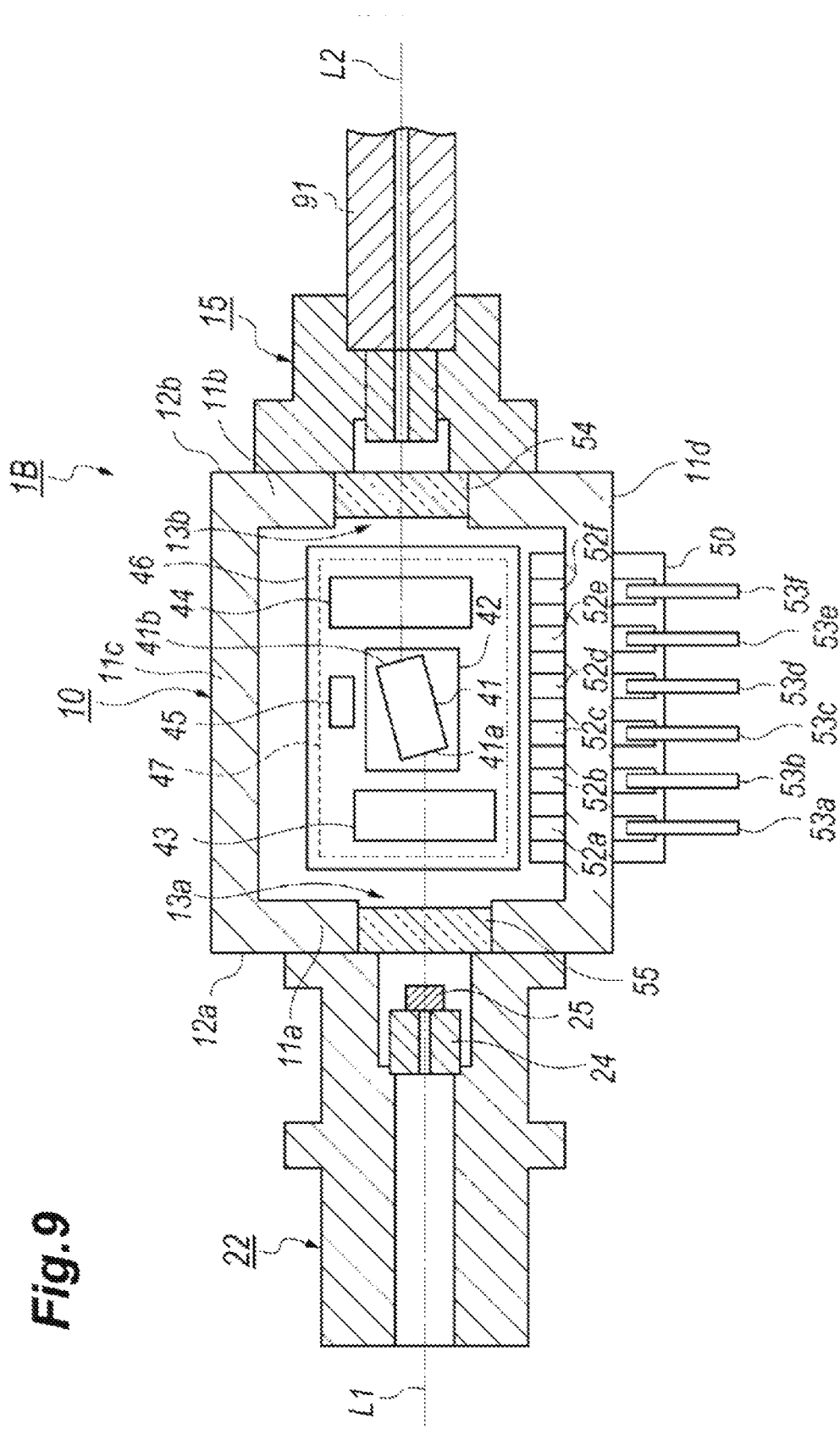
FIG. 9 is a transverse cross section of the amplifying unit 1B of the second embodiment.

FIG. 9 is a transverse cross section of the amplifying unit 1B of the present embodiment. The amplifying unit 1B provides, in addition to the optical fiber 91, another rear coupling unit 15 having a cylindrical shape and fixed in one end thereof to the rear surface of the housing 10 by the welding. The other end of the rear coupling unit 15 receives an end of the optical fiber 91. The other end of the optical fiber 91 is connected to the housing 60 of the receiver unit 2A. The optical signal amplified by the SOA 41 in the amplifying unit 1B may be provided to the receiver unit 2A through the optical fiber 91. The optical coupling between the rear coupling unit 15 and the optical fiber 91 may be a type of, what is called, the pig-tail arrangement where the optical fiber 91 is permanently fixed to the rear coupling unit 91.

The optical apparatus 500B of the present embodiment, similar to the aforementioned apparatus 500A, provides the amplifying unit 1B that pluggably receives the optical plug 93 secured in the end of the optical fiber 91 by the front coupling unit 22 directly assembled with the housing 10 without interposing any optical fibers. The front coupling unit 22 may operate as an optical receptacle capable of mating with the optical plug 93 of the optical fiber 92. Accordingly, this arrangement of the optical apparatus 500B may enhance the freedom of the installation thereof within the optical system, and the optical system may be formed in compact.

(Third Embodiment)

Figure 10:
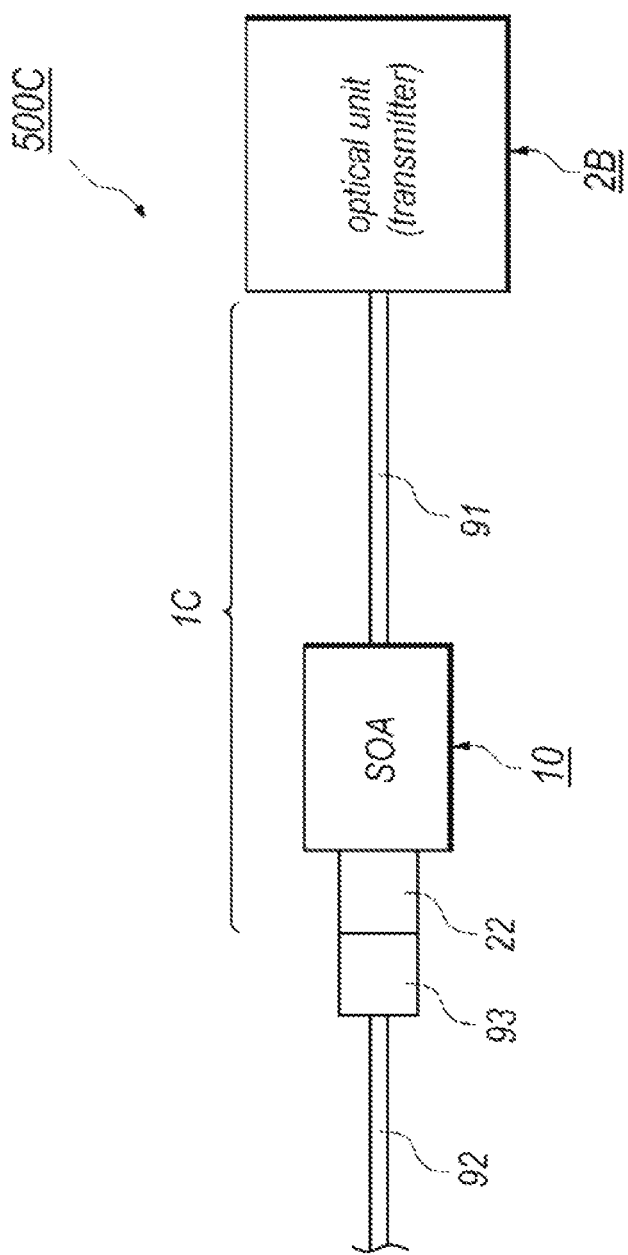
FIG. 10 schematically illustrates still another optical apparatus according to the third embodiment of the present application.

FIG. 10 schematically illustrates an optical apparatus 500C according to the third embodiment of the present application, where the optical apparatus 500C includes the amplifying unit 1C and a transmitter unit 2B. The amplifying unit 1C, same with the optical apparatus 1B of the previous embodiment, provides the optical fiber 91 instead of the rear coupling unit 14 in the first embodiment, and couples with the transmitter unit 2B through this optical fiber 91. The transmitter unit 2B encloses a light-emitting device and the SOA 41 in the amplifying unit 1C receives light from the transmitter unit 2B through the optical fiber 91 and outputs amplified light to the external optical finer 92 through the front coupling unit 22.

Figure 11:
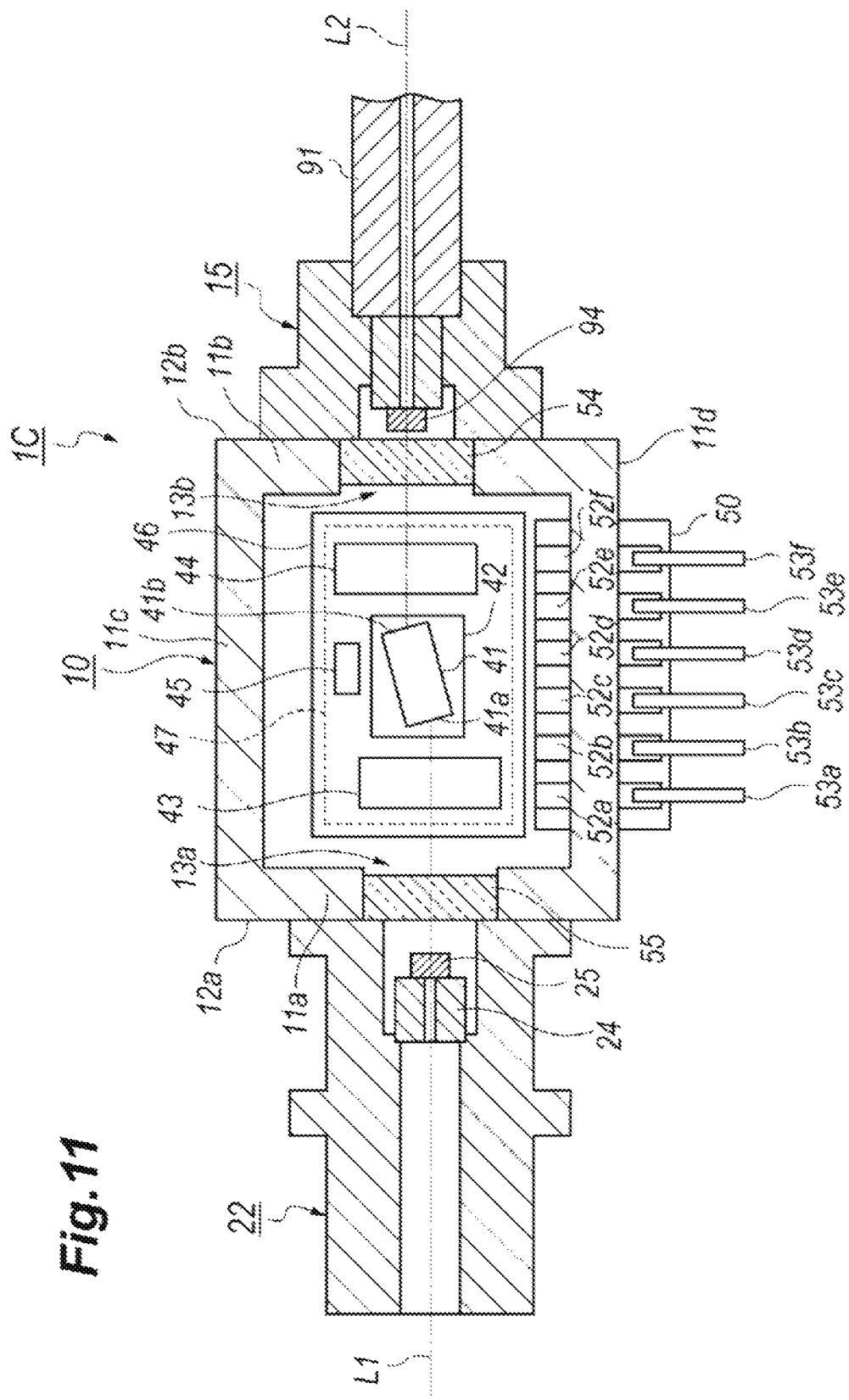
FIG. 11 shows a transverse cross section of the amplifying unit of the third embodiment show in FIG. 10.

FIG. 11 shows a transverse cross section of the amplifying unit 1C. The amplifying unit 1C of the present embodiment has features distinguishable from the aforementioned amplifying unit 1B that the rear coupling unit 15 provides an optical isolator 94 therein on the optical axis L2. The optical isolator 94 passes light coming from the transmitter unit 2B toward the SOA 41 but cuts light coming from the SOA 41 toward the transmitter unit 2B. The amplifying unit 1C of the present embodiment, similar to the previous amplifying unit 1B, may pluggably receive the optical plug secured in the optical fiber 92, which enhances the freedom of the installation of the amplifying unit 1C, or the optical apparatus 500C within the system.

(Fourth Embodiment)

Figure 12:
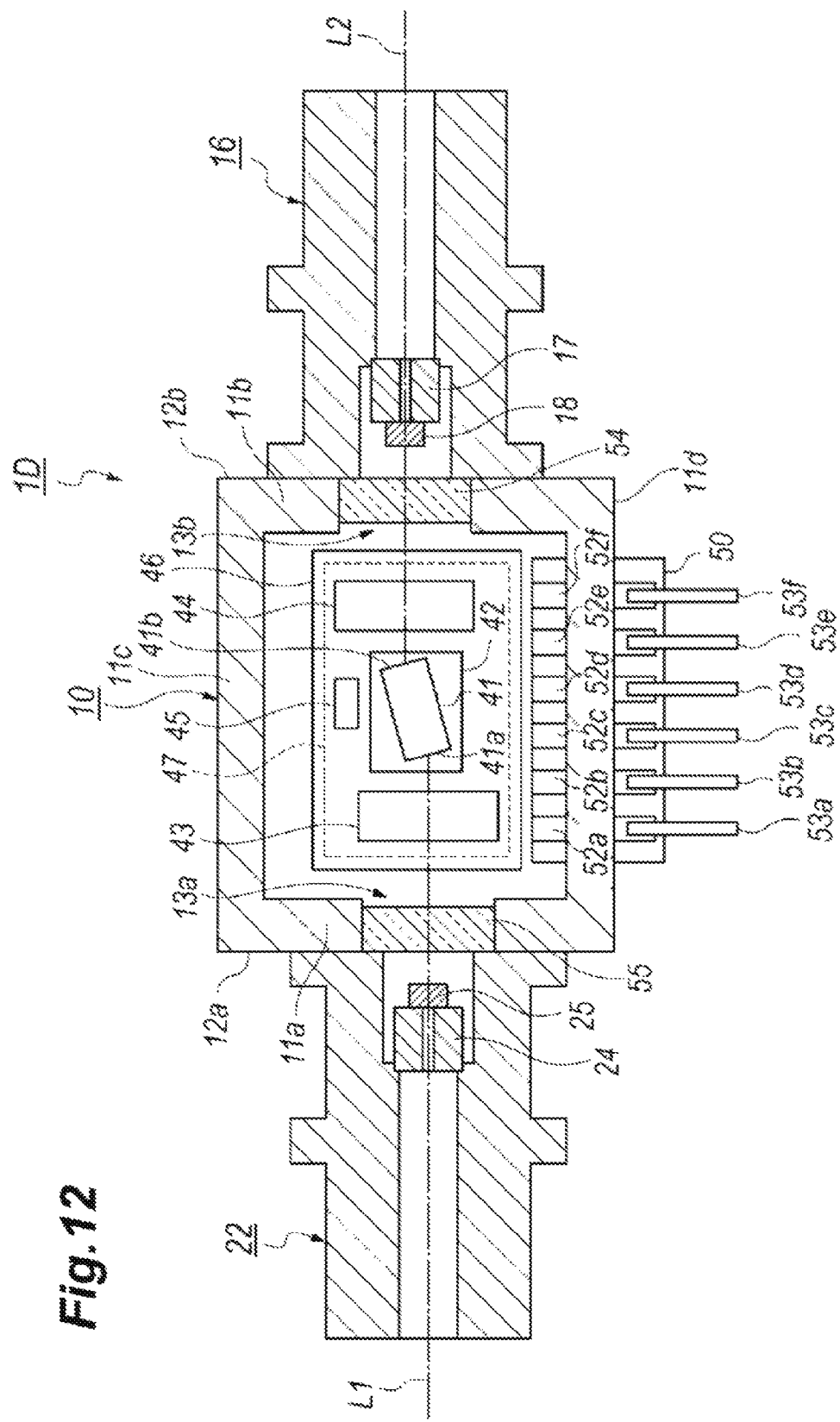
FIG. 12 shows a transverse cross section of still another amplifying unit according to the fourth embodiment of the present application.

FIG. 12 shows a transverse cross section of still another amplifying unit 1D according to the fourth embodiment of the present application. The amplifying unit 1D shown in FIG. 12 provides another rear coupling unit 16 instead of the rear coupling units, 14 and 15, of the aforementioned embodiment. The present rear coupling unit 16 has an arrangement similar to that of the front coupling unit 22. That is, the rear coupling unit 16 may pluggably receive an optical plug secured in the optical fiber 91 connecting the amplifying unit 1D with the optical unit, 2A or 2B. Also, the amplifying unit 1D provides the rear opening 13b holding a lens 54 instead of the window 51.

The rear coupling unit 16, which may be made of, for instance, stainless steel, is fixed to the rear surface 12b by the welding and passes the optical axis L2 extending from the rear facet 41b of the SOA 41. As described, the rear coupling unit 16 may pluggably receive the optical plug, which is not shown in the figures, of the optical fiber 91 extending from the optical unit 2B, accordingly, the rear coupling unit 16 may be a type of the optical receptacle. The rear coupling unit 16 implements a stub 17 and an optical isolator 18 similar to the front coupling unit 22. The stub 17, which may be made of ceramics, defines the position of the end of the optical plug mated therewith. That is, abutting the tip of the optical plug against the stub 17 in a surface not providing the optical isolator, the position of the optical plug may be automatically defined. The optical isolator 18 passes light coming from the optical unit 2B toward the SOA 41 but cuts light coming from the SOA 41 toward the optical unit 2B.

The amplifying unit 1D of the present embodiment, similar to the aforementioned embodiment, provides the front coupling unit 22 capable of pluggably receiving the optical plug secured in the external optical fiber 92, and the front coupling unit 22 is directly fixed to the housing 10 of the amplifying unit 1D. This arrangement may enhance the flexibility of the installation of the amplifying unit 1D, or the optical apparatus 500C, within the system.

(Fifth Embodiment)

Figure 13:
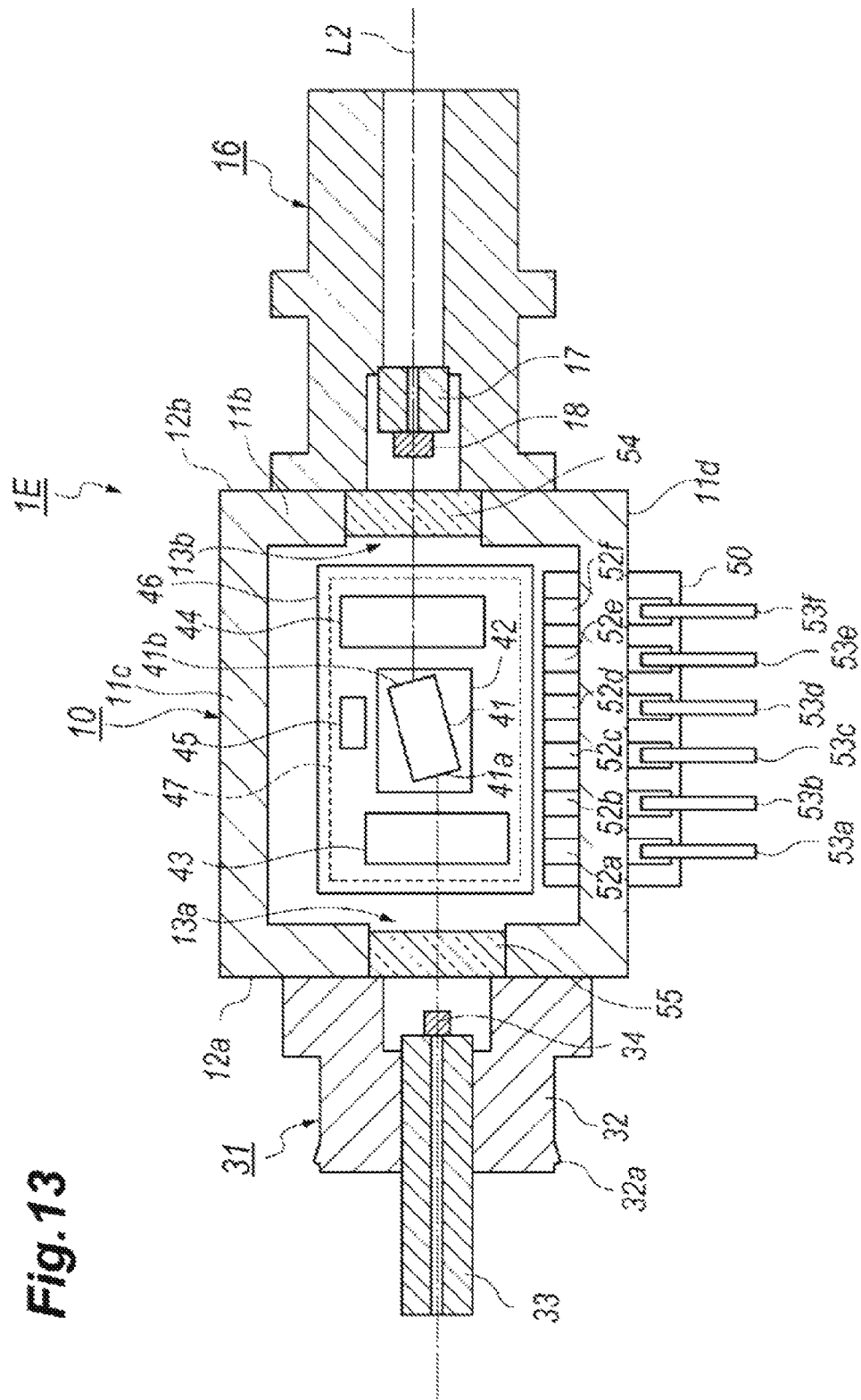
FIG. 13 shows a transverse cross section of still another amplifying unit according to the fifth embodiment of the present invention.
Figure 14:
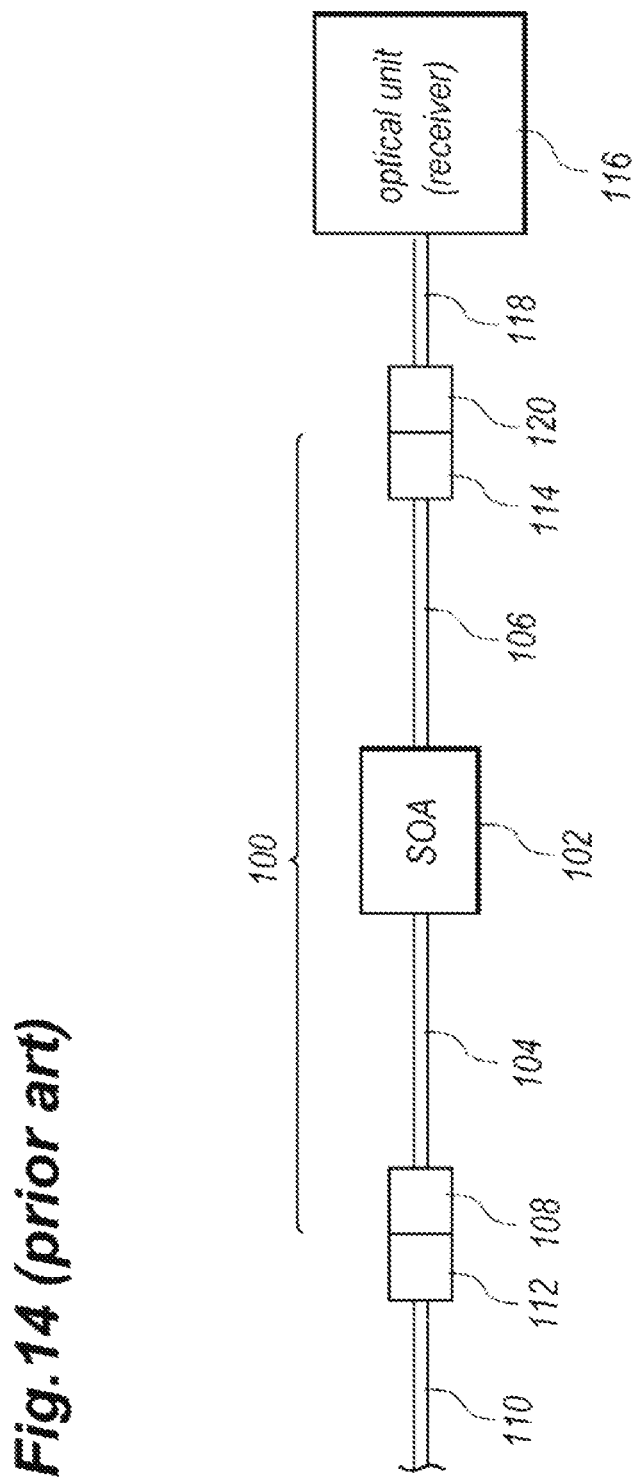
FIG. 14 is a block diagram of an optical apparatus including an amplifying unit according to the conventional arrangement.

FIG. 13 is a transverse cross section of still another amplifying unit 1E according to the fifth embodiment of the present invention. The amplifying unit 1E has features distinguishable from aforementioned embodiment that the amplifying unit 1E provides a front coupling unit 31, substituted from the front coupling unit 22 of the receptacle type, namely, the female type coupling, having a male type coupling.

The front coupling unit 31 provides a sleeve 32, which may be made of plastics, and a ferrule 33. The sleeve 32 is fixed in one end thereof to the front surface 12a and passes the front optical axis L1 extending from the front facet 4a of the SOA 41. A feature of the sleeve 31 is that a front end thereof 32a is thickened to latch an external optical connector with the female type. Because the thickened portion 32a is limited in the sleeve 32, the external connector of the female type may be pluggably mated with the sleeve. The front coupling unit 31 also provides an optical isolator 34 in an end of the ferrule 33 to pass light coming from the SOA 41 externally but cuts light entering the amplifying unit 1E.

The amplifying unit 1E of the present embodiment provides the front coupling unit 31 directly fixed to the housing 10 without interposing any optical, fibers. The front coupling unit 31, which provides the coupling system of the male type, may pluggably receive the optical connector with the female type. This arrangement of the front coupling unit 31 may enhance the flexibility of the installation of the amplifying unit 1E, or the optical apparatus within the system.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. An optical apparatus, comprising:
an amplifier unit includes,
a semiconductor optical amplifier (SOA) to amplify an optical signal therein, the SOA having a front facet and a rear facet, and
a housing that encloses the SOA therein, the housing providing a front wall and a rear wall, the front wall having a front window that passes a front optical axis extending from the front facet of the SOA, the rear wall having a rear window that passes a rear optical axis extending from the rear facet of the SOA;
a front coupling unit fixed to the front wall of the housing of the amplifier unit, the front coupling unit pluggably receiving an external optical fiber;
a rear coupling unit; and
an optical unit; and
wherein the optical unit has a housing including a front wall, the rear coupling unit being fixed to the rear wall of the amplifier unit and to a front wall of the optical unit, the rear coupling unit passing the rear optical axis extending from the rear facet of the SOA to the optical unit,
wherein the housing of the optical amplifier unit and the housing of the optical unit each provide flexible printed circuit (FPC) boards extending substantially in parallel to each other at a rear wall of the housing of the optical unit,
wherein one of the FPC boards extends upward along a side wall of the housing of the amplifier unit that is perpendicular to the front wall and the rear wall of the housing of the amplifier unit, extends rearward along a lid of the amplifier unit that extends perpendicular to the front, rear, and side walls of the housing of the amplifier unit, and
wherein another of the FPC boards extends rearward from the rear wall of the housing of the optical unit.

2. The optical apparatus of claim 1,
wherein a level of the front optical axis measured from a bottom of the housing of the optical unit coincides with a level of the rear optical axis measured from the bottom of the housing of the optical unit.

3. The optical apparatus of claim 2,
wherein the housing of the amplifier unit provides a spacer in a bottom thereof.

4. The optical apparatus of claim 1,
wherein the amplifier unit provides rooms in respective sides of the housing thereof.

5. The optical apparatus of claim 1,
wherein the rear coupling unit is fixed to the rear wall of the housing,
wherein the rear coupling unit pluggably receives another external optical fiber.

6. The optical apparatus of claim 1,
further comprising another external optical fiber,
wherein the rear coupling unit is fixed to the rear wall of the housing of the amplifier unit, and permanently fixes the another external optical fiber by an arrangement of a pig-tail coupling, and
wherein the optical unit is one of a receiver unit and a transmitter unit, the receiver unit receiving another optical signal amplified by the SOA, the transmitter unit transmitting another optical signal to the SOA.

7. The optical apparatus of claim 1,
wherein the front coupling unit includes a sleeve that receives a ferrule secured in an end of the external optical fiber.

8. The optical apparatus of claim 1,
wherein the front coupling unit includes a ferrule plugged with an external connector provided in an end of the external optical fiber.

* * * * *